United States Patent
Chen et al.

(10) Patent No.: US 10,312,414 B1
(45) Date of Patent: Jun. 4, 2019

(54) LIGHT EMITTING UNIT AND DISPLAY DEVICE

(71) Applicant: InnoLux Corporation, Miao-Li County (TW)

(72) Inventors: Jia-Yuan Chen, Miao-Li County (TW); Kuan-Feng Lee, Miao-Li County (TW); Tsung-Han Tsai, Miao-Li County (TW); Hsiao-Lang Lin, Miao-Li County (TW); Jui-Jen Yueh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 15/829,395

(22) Filed: Dec. 1, 2017

(51) Int. Cl.
| | |
|---|---|
| *H01L 33/44* | (2010.01) |
| *H01L 25/075* | (2006.01) |
| *H01L 33/22* | (2010.01) |
| *H01L 33/32* | (2010.01) |
| *H01L 33/46* | (2010.01) |
| *H01L 33/50* | (2010.01) |
| *H01L 33/56* | (2010.01) |
| *H01L 33/62* | (2010.01) |
| *H01L 33/38* | (2010.01) |

(52) U.S. Cl.
CPC .......... *H01L 33/44* (2013.01); *H01L 25/0753* (2013.01); *H01L 33/22* (2013.01); *H01L 33/32* (2013.01); *H01L 33/382* (2013.01); *H01L 33/46* (2013.01); *H01L 33/502* (2013.01); *H01L 33/56* (2013.01); *H01L 33/62* (2013.01); *H01L 2933/0083* (2013.01)

(58) Field of Classification Search
CPC ....... H01L 33/44; H01L 33/382; H01L 33/62; H01L 33/56; H01L 33/502; H01L 33/32; H01L 33/22; H01L 25/0753; H01L 33/46; H01L 2933/0083
See application file for complete search history.

(56) References Cited

U.S. PATENT DOCUMENTS

| | | | |
|---|---|---|---|
| 2011/0186813 A1* | 8/2011 | Kim | H01L 33/44 257/13 |
| 2012/0001222 A1* | 1/2012 | Moon | H01L 33/44 257/99 |
| 2014/0160754 A1 | 6/2014 | Lee et al. | |
| 2016/0351754 A1 | 12/2016 | Kim et al. | |
| 2016/0351755 A1 | 12/2016 | Lee et al. | |
| 2016/0351762 A1 | 12/2016 | Sato | |
| 2016/0351764 A1 | 12/2016 | Cha et al. | |
| 2016/0351767 A1 | 12/2016 | Choi et al. | |
| 2016/0372636 A1 | 12/2016 | Hwang et al. | |
| 2017/0005242 A1 | 1/2017 | Kim et al. | |
| 2017/0033268 A1 | 2/2017 | Lee et al. | |
| 2017/0067620 A1 | 3/2017 | Sano et al. | |
| 2017/0117439 A1 | 4/2017 | Kim | |

* cited by examiner

*Primary Examiner* — David Vu
(74) *Attorney, Agent, or Firm* — Muncy, Geissler, Olds & Lowe, P.C.

(57) ABSTRACT

A light emitting unit and a display device is disclosed, wherein the display device includes: a light emitting unit, including: a first semiconductor layer; an active layer disposed on the first semiconductor layer; a second semiconductor layer disposed on the active layer; and a first protecting layer disposed on the second semiconductor layer, wherein the first protecting layer includes oxygen, nitrogen, and at least one element selected from the group consisting of Al, Ga, In, and Si.

19 Claims, 10 Drawing Sheets

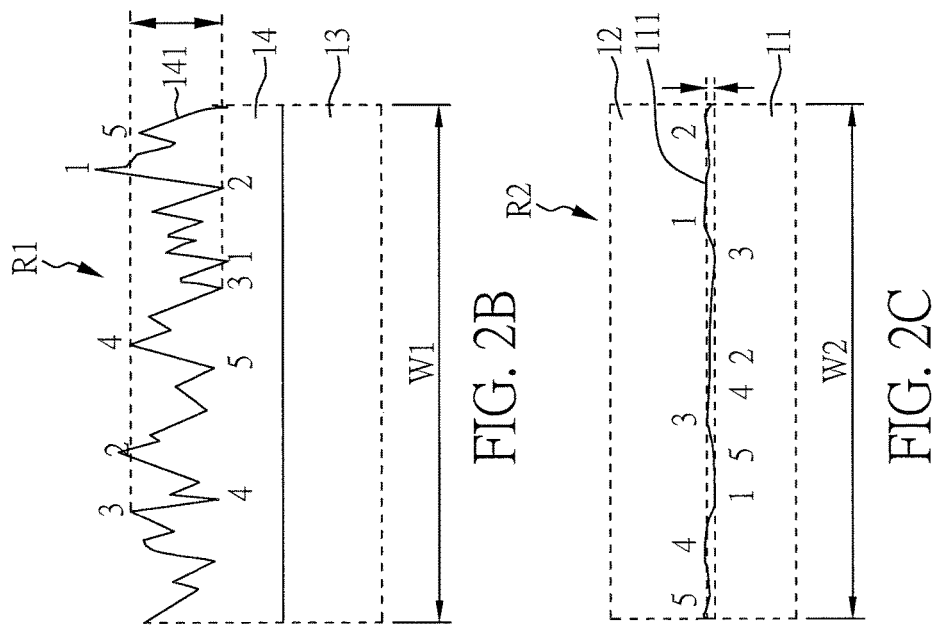
FIG. 2B
FIG. 2C
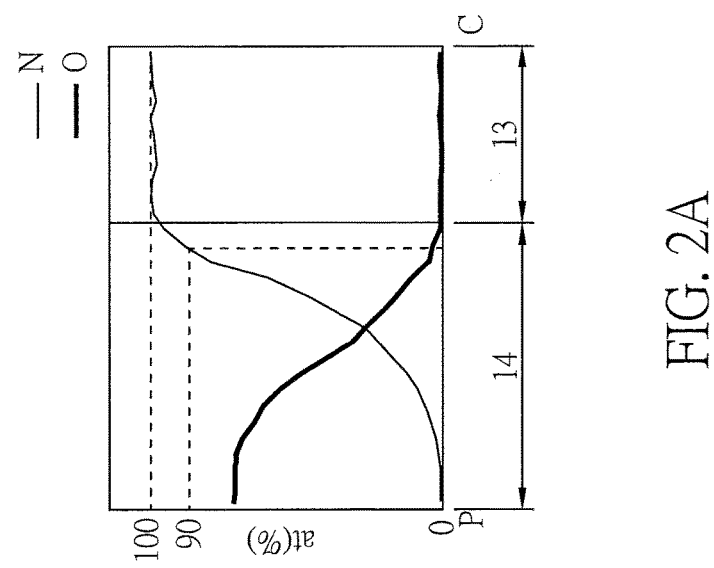
FIG. 2A

LIGHT EMITTING UNIT AND DISPLAY DEVICE

BACKGROUND

1. Field

The present disclosure relates to a light emitting unit and a display device using the same.

2. Description of Related Art

With the continuous advancement of technologies related to displays, all the display apparatuses are now developed toward compactness, thinness, and lightness. Applications of thin displays are numerous. Most electronic products for daily use, such as mobile phones, notebook computers, video cameras, still cameras, music displays, mobile navigators, and TV sets, employ such display panels.

Herein, one kind of the light source used in the display device can be a light emitting diode. Even though the development of the light emitting diode is getting matured, many manufacturers are desired to provide a light emitting diode with improved chip reliability or enhanced light extraction efficiency.

Therefore, it is desirable to provide a light emitting unit and a display device using the same, which has improved chip reliability or enhanced light extraction efficiency.

SUMMARY

The present disclosure provides a display device, which comprises: a light emitting unit, comprising: a first semiconductor layer; an active layer disposed on the first semiconductor layer; a second semiconductor layer disposed on the active layer; and a first protecting layer disposed on the second semiconductor layer, wherein the first protecting layer comprises oxygen, nitrogen, and at least one element selected from the group consisting of Al, Ga, In, and Si.

The present disclosure also provides a light emitting unit, which comprises: a first semiconductor layer; an active layer disposed on the first semiconductor layer; a second semiconductor layer disposed on the active layer; and a first protecting layer disposed on the second semiconductor layer, wherein the first protecting layer comprises oxygen, nitrogen, and at least one element selected from the group consisting of Al, Ga, In, and Si.

Other novel features of the disclosure will become more apparent from the following detailed description when taken in conjunction with the accompanying drawings.

BRIEF DESCRIPTION OF THE DRAWINGS

FIG. 2A is a diagram showing nitrogen and oxygen atomic percentages in a second semiconductor layer and a first protecting layer of a light emitting unit according to Embodiment 1 of the present disclosure.

FIG. 2B is an enlarged view of a region R1 indicated in FIG. 1 according to another embodiment of the present disclosure.

FIG. 2C is an enlarged view of a region R2 indicated in FIG. 1 according to another embodiment of the present disclosure.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other element, but also intended indirectly contact with the other element. Similarly, the ordinals recited in the specification and the claims such as "below", or "under" are intended not only directly contact with the other element but also intended indirectly contact with the other element.

In addition, the features in different embodiments of the present disclosure can be mixed to form another embodiment.

Embodiment 1

Figure 1:
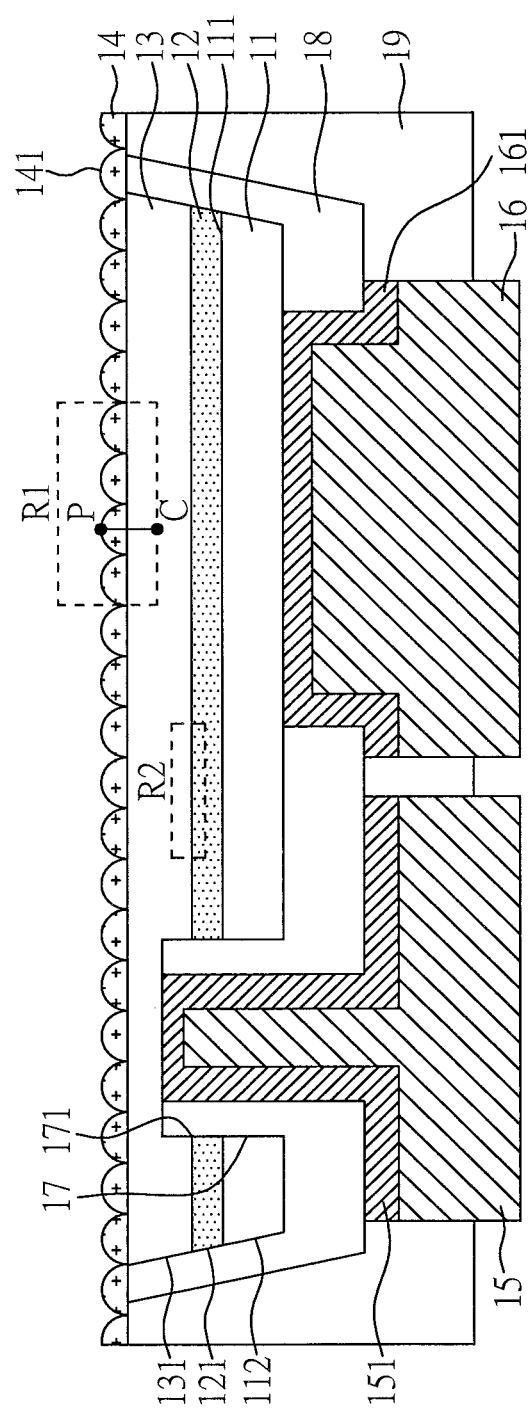
FIG. 1 is a cross-sectional view of a light emitting unit according to Embodiment 1 of the present disclosure.

FIG. 1 is a cross-sectional view of a light emitting unit of the present embodiment. The light emitting unit of the present embodiment comprises: a first semiconductor layer 11; an active layer 12 disposed on the first semiconductor layer 11; a second semiconductor layer 13 disposed on the active layer 12; and a first protecting layer 14 disposed on the second semiconductor layer 13, wherein the first protecting layer 14 comprises oxygen, nitrogen, and at least one element selected from the group consisting of Al, Ga, In, and Si.

The light emitting unit of the present embodiment may be a light emitting diode. The size of the light emitting unit could be ranged from 0.1 μm to 100 μm, which is called a micro-LED; or ranged from 100 μm to 300 μm, which is called a mini-LED; or above 300 μm, which is called a normal LED. The active layer 12 of the light emitting unit play as a quantum well layer, the material of the active layer 12 could be organic material or inorganic material, and the active layer 12 may have quantum dot material. The material of the first semiconductor layer 11 could be P-type semiconductor or N-type semiconductor, the material of the second semiconductor layer 13 could be N-type semiconductor or P-type semiconductor, and the material of the second semiconductor layer 13 is opposite to the material of the first semiconductor layer 11 (P-N pair).

Since the second semiconductor layer 13 may be easily damaged, the first protecting layer 14 is disposed on the second semiconductor layer 13 to prevent the damage of the second semiconductor layer 13; thus the reliability of the light emitting unit can further be improved. In addition, the light emitting unit of the present embodiment is a top-emission light emitting unit. While the first protecting layer 14 is disposed between the second semiconductor layer 13 and a layer (not shown in the figure), the refractive index of the first protecting layer 14 is between the refractive index of the second semiconductor layer 13 and the refractive index of the layer to reduce total reflection occurred.

Herein, the dominant material of the first semiconductor layer 11, the active layer 12 and the second semiconductor layer 13 can be GaN or other semiconductor material suitable for a light emitting diode. In consideration of the lattice match between the second semiconductor layer 13 and the first protecting layer 14, the material for the first protecting layer 14 may comprise oxygen, nitrogen, and at least one element selected from the group consisting of Al, Ga, In, and Si.

In one aspect, the material of the second semiconductor layer 13 is GaN, and the material of the first protecting layer 14 is $GaO_xN_y$. The refractive index of GaN is 2.5, and the refractive index of $GaO_xN_y$ is between 1.8 and 2.5. Hence, the refractive index difference between the second semiconductor layer 13 and the first protecting layer 14 is lowered than the refractive index difference between the second semiconductor layer 13 and the layer (not shown in the figure) above the first protecting layer 14 and the second semiconductor layer 13, and thus the total reflections can be reduced.

FIG. 2A is a diagram showing nitrogen and oxygen atomic percentages in the second semiconductor layer 13 and the first protecting layer 14 of a light emitting unit. As shown in FIG. 1 and FIG. 2A, in the present embodiment, the second semiconductor layer 13 and the first protecting layer 14 can be differentiated via the following measurement procedure. Herein, the atomic percentages in the second semiconductor layer 13 and the first protecting layer 14 can be examined via Energy dispersive spectroscopy (EDX), Secondary-ion mass spectrometry (SIMS), X-ray photoelectron spectroscopy (XPS) or other suitable equipment. In the present disclosure, an element content means an atomic percentage (at %) or a ratio of a target element atomic to whole measuring elements' atomics at a measuring region or a measuring point. For example, a nitrogen content or a nitrogen atomic percentage means a percentage or a ratio of nitrogen atomic to whole measuring elements' atomics at a measuring region or a measuring point.

First, nitrogen content at the center C of the second semiconductor layer 13 is measured, and the obtained nitrogen content at the center C is defined as 100%. Next, a point with a nitrogen content being 90% based on the obtained nitrogen content at the center C is defined. Then, the oxygen content at this point is measured. It can be found that both oxygen and nitrogen are present at this point located in the first protecting layer 14

As shown in FIG. 2A, close to the second semiconductor layer 13, the first protecting layer 14 has a first oxygen atomic percentage and a first nitrogen atomic percentage, and the first oxygen atomic percentage is less than the first nitrogen atomic percentage.

In addition, as shown in FIG. 1, the first protecting layer 14 has a first top surface 141, which is a rough surface. Herein, after forming the first protecting layer 14, an imprinting process or other patterning process is performed on the first protecting layer 14 to form the rough surface. When the first top surface 141 of the first protecting layer 14 is a rough surface, the light extraction or uniformity of the light emitting unit can further be increased.

In addition, the first semiconductor layer 11 has a second top surface 111. The first top surface 141 has a first roughness, the second top surface 111 has a second roughness, and the first roughness is greater than the second roughness. Herein, the first roughness of the first top surface 141 and the second roughness of the second top surface 111 can be examined from SEM cross-section image.

In the aspect shown in FIG. 1, the first top surface 141 is a rough surface with plural uniform arc shapes. However, the present disclosure is not limited thereto.

For example, FIG. 2B is an enlarged view of a region R1 indicated in FIG. 1 according to another embodiment of the present disclosure. In this embodiment, the first top surface 141 is not a uniform rough surface. In addition, FIG. 2C is an enlarged view of a region R2 indicated in FIG. 1 according to another embodiment of the present disclosure, and the second top surface 111 is also not a uniform rough surface. When the first top surface 141 and the second top surface 111 are not uniform rough surfaces, the first roughness and the second roughness can be defined as follow. First, the region R1 with a width W1 ranged from 3 μm to 30 μm and the region R2 with a width W2 ranged from 3 μm to 30 μm are examined. Top 5 high peaks and top 5 low peaks can be respectively found in the region R1 and the region R2. The height difference between the third high peak and the third low peak in the region R1 is defined as the first roughness, and the height difference between the third high peak and the third low peak in the region R2 is defined as the second roughness.

As shown in FIG. 1, to form the electrodes of the light emitting unit, a via hole 17 is firstly formed through a lithography process. Next, a passivation layer 18 is formed on the first semiconductor layer 11 and in the via hole 17. The material for the passivation layer 18 can be, for example, a silicon oxide, a silicon oxynitride, a silicon nitride, aluminum oxide, resin, polymer, photoresist, or a combination thereof, but the present disclosure is not limited thereto. Then, a first contact electrode 151 and a second contact electrode 161 are formed on the same side of the first semiconductor layer 11 and in the via hole 17 by a metalorganic chemical vapor deposition (MOCVD), physical vapor deposition (PVD) process, electroplating process, or other thin film deposition process, but the present disclosure is not limited thereto. Herein, the material for the first contact electrode 151 and the second contact electrode 161 can respectively a reflective electrode material, such as Ag, Al, Ni, Cr, Cu, Au, Pd, Pt, Sn, W, Rh, Jr, Ru, Mg, Zn, or an alloy thereof, but the present disclosure is not limited thereto. Finally, a first electrode 15 and a second electrode 16 are formed on the first contact electrode 151 and the second contact electrode 161 by the MOCVD, the PVD, the electro plating process, or other deposition process, but the present disclosure is not limited thereto. Herein, the material for the first electrode 15 and the second electrode 16 can be, for example, Ag, Al, Ni, Cr, Cu, Au, Pd, Pt, or an alloy thereof, but the present disclosure is not limited thereto.

Hence, the light emitting unit of the present embodiment further comprises a first electrode 15 and a second electrode 16 disposed at the same side of the light emitting unit, the first electrode 15 electrically connects to the second semiconductor layer 13, and the second electrode 16 electrically connects to the first semiconductor layer 11. In addition, the second electrode 16 is disposed below the first semiconductor layer 11, the first electrode 15 is disposed below the first semiconductor layer 11, and a via hole 17 penetrates through the first semiconductor layer 11 and the active layer 12, and at least a part of the first electrode disposed in the via hole 17. A part of the via hole 17 is further extended into the second semiconductor 13, and a part of the first electrode 15 is further embedded into the second semiconductor layer 13.

In the present embodiment, the via hole 17 is firstly formed through a lithography process, which required high accuracy. However, when the first electrode 15 is formed in the via hole 17 to electrically connect to the second semiconductor layer 13, the area for forming the first electrode 15 can be reduced, all the area except the region with the via hole 17 can emit light, and therefore the area capable of emitting light can be increased.

Furthermore, the light emitting unit further comprises a passivation layer 18, the passivation layer 18 is disposed between the first electrode 15 in the via hole 17 and the first semiconductor layer 11, and the passivation layer 18 could be also disposed on a side wall 171 of the via hole 17.

In the present embodiment, the light emitting unit further comprises a first contact electrode 151 and a second contact electrode 161, which can facilitate the formation of the first electrode 15 and the second electrode 16. However, in another embodiment of the present disclosure, the light emitting unit does not comprise the aforesaid first contact electrode 151 and the second contact electrode 161.

In addition, the light emitting unit further comprises a first encapsulating layer 19, the first encapsulating layer 19 is around a part of the first electrode 15 and a part of the second electrode 16 and is disposed on a side wall 112 of the first semiconductor layer 11, a side wall 121 of the active layer 12 and a side wall 131 of the second semiconductor layer 13. Herein, the material for the first encapsulating layer 19 can be silicon oxide, silicon nitride, silicon oxynitride, aluminum oxide, resin, polymer, photoresist, other non-sulfur inorganic or organic encapsulating material, or a combination thereof.

Embodiment 2

Figure 3:
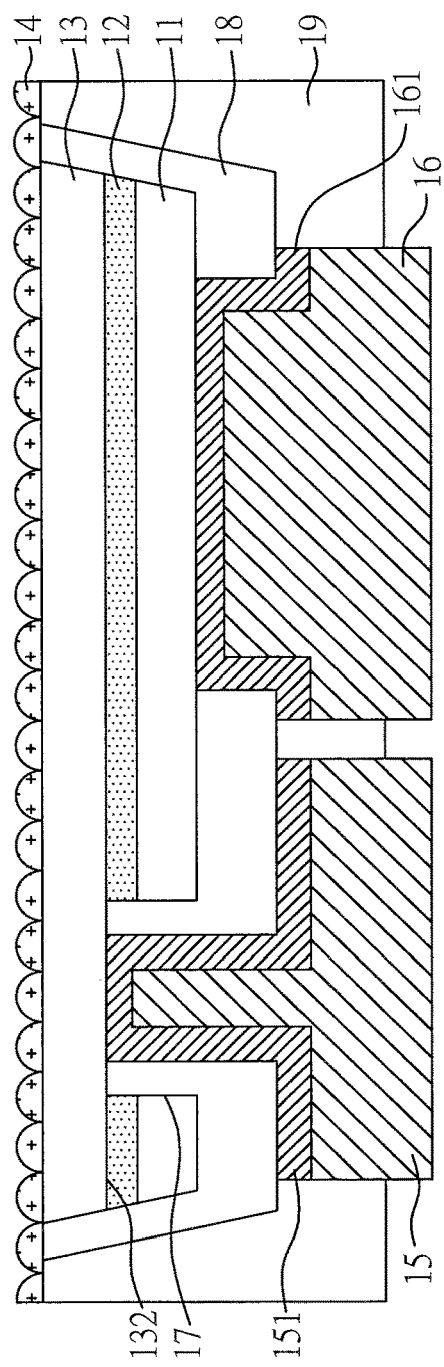
FIG. 3 is a cross-sectional view of a light emitting unit according to Embodiment 2 of the present disclosure.

FIG. 3 is a cross-sectional view of a light emitting unit of the present embodiment. The light emitting unit of the present embodiment is similar to that shown in Embodiment 1, except that the first electrode 15 is not embedded into the second semiconductor layer 13. More specifically, the first electrode 15 contacts a bottom surface 132 of the second semiconductor layer 13.

Embodiment 3

Figure 4:
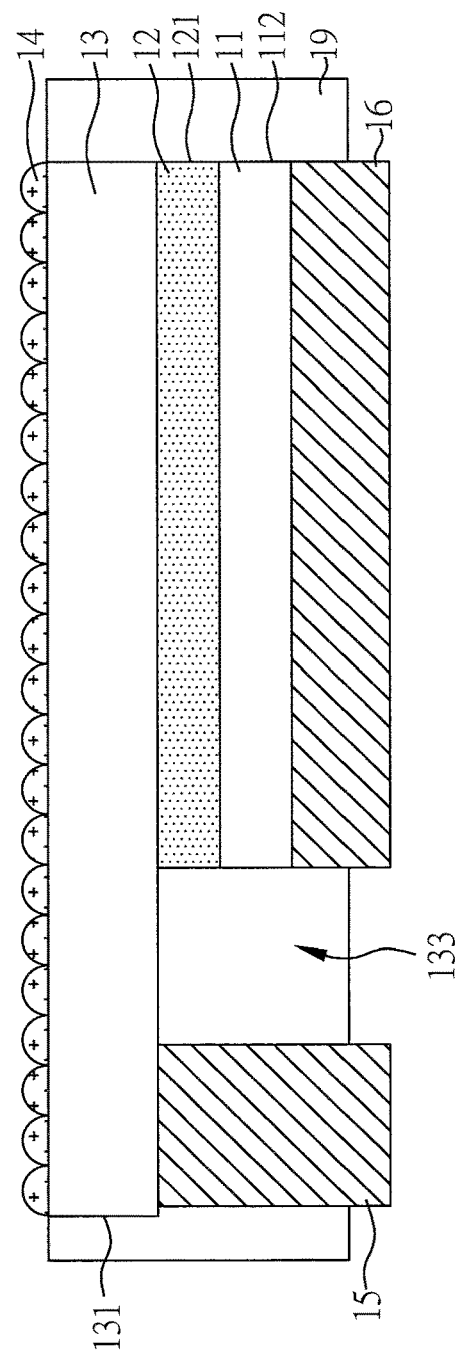
FIG. 4 is a cross-sectional view of a light emitting unit according to Embodiment 3 of the present disclosure.

FIG. 4 is a cross-sectional view of a light emitting unit of the present embodiment. The light emitting unit of the present embodiment is similar to that shown in Embodiment 1, except the following differences.

In the present embodiment, a mesa process is performed to form a cavity 133 near to the first semiconductor layer 11 and the active layer 12. Next, a first electrode 15 is formed in the cavity 133 and a second electrode 16 is formed on the first semiconductor layer 11. Then, a first encapsulating layer 19 is formed, wherein the first encapsulating layer 19 is around a part of the first electrode 15 and a part of the second electrode 16 and is disposed on a side wall 112 of the first semiconductor layer 11, a side wall 121 of the active layer 12 and a side wall 131 of the second semiconductor layer 13. The first encapsulating layer 19 may be disposed in a part of the cavity 133.

The process for forming the light emitting unit of Embodiment 1 is more complex than the process of the present embodiment. However, since the area of first semiconductor layer 11 and the active layer 12 on the second semiconductor layer 13 is decreased in the present embodiment, the area capable of emitting light in the light emitting unit of the present embodiment is less than the area capable of emitting light in Embodiment 1.

Embodiment 4

Figure 5:
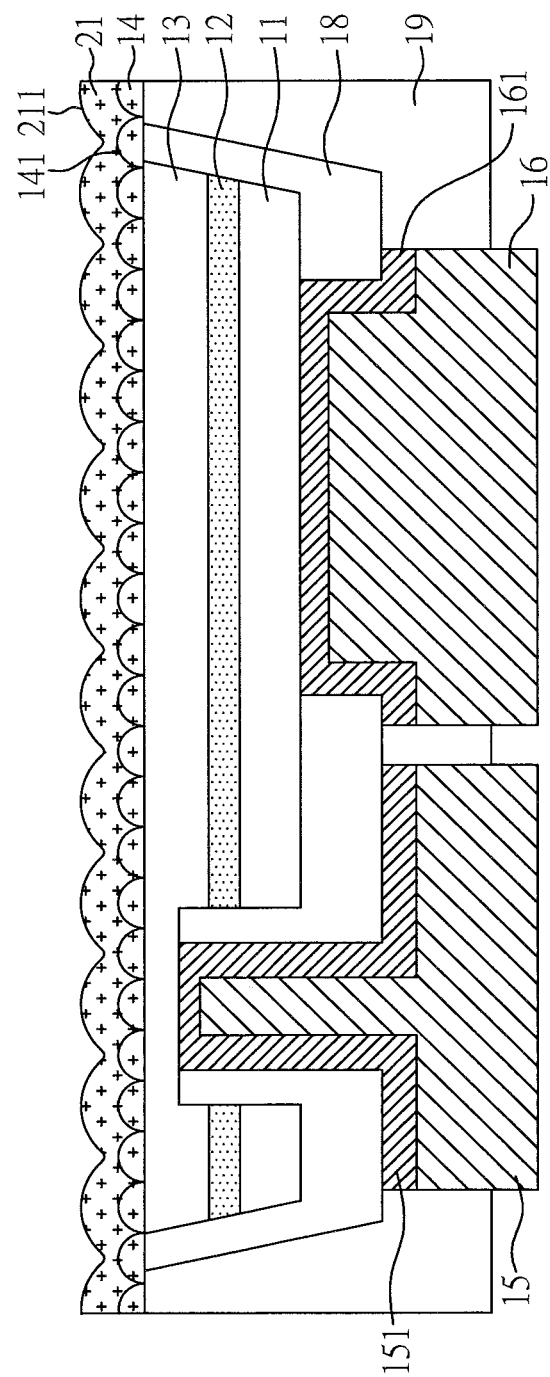
FIG. 5 is a cross-sectional view of a light emitting unit according to Embodiment 4 of the present disclosure.

FIG. 5 is a cross-sectional view of a light emitting unit of the present embodiment. The light emitting unit of the present embodiment is similar to that shown in Embodiment 1, except the following difference.

In the present embodiment, the light emitting unit further comprises a second protecting layer 21 disposed on the first protecting layer 14, wherein the first protecting layer 14 has a first top surface 141, the second protecting layer 21 has a third top surface 211, the first top surface 141 has a first roughness, the third top surface 211 has a third roughness, and the first roughness is greater than the third roughness. In another embodiment of the present disclosure, the third top surface 211 is not a uniform rough surface; in this case, the third roughness can be defined by the same method shown in FIG. 2B and FIG. 2C.

Herein, the material for the second protecting layer 21 can be, for example, silicon oxide, silicon nitride, silicon oxynitride, aluminum oxide, resin, polymer, photoresist, or a combination thereof, but the present disclosure is not limited thereto.

In one aspect of the present disclosure, when the second protecting layer 21 is an oxide film, the second protecting layer 21 has a second oxygen atomic percentage, and the first oxygen atomic percentage of the first protecting layer 14 is less than the second oxygen atomic percentage of the second protecting layer 21.

In another aspect of the present disclosure, when the second protecting layer 21 is a nitride film, the second protecting layer 21 has a second nitrogen atomic percentage, and the first nitrogen atomic percentage of the first protecting layer 14 is less than the second nitrogen atomic percentage of the second protecting layer 21.

Embodiment 5

Figure 6:
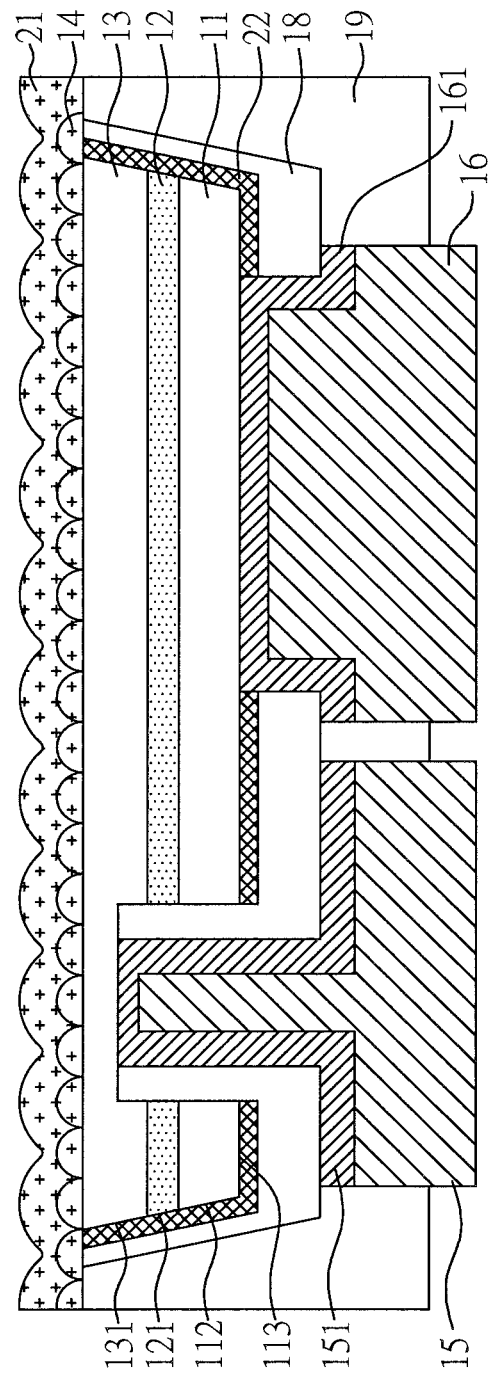
FIG. 6 is a cross-sectional view of a light emitting unit according to Embodiment 5 of the present disclosure.

FIG. 6 is a cross-sectional view of a light emitting unit of the present embodiment. The light emitting unit of the present embodiment is similar to that shown in Embodiment 4, except the following difference.

In the present embodiment, the light emitting unit further comprises a reflecting layer 22, the first semiconductor layer 11 has a bottom surface 113, the second electrode 16 is disposed on the bottom surface 113, and the reflecting layer 22 is disposed on the bottom surface 113 without the second electrode 161 formed thereon.

In addition, the reflecting layer 22 is further disposed on a side wall 112 of the first semiconductor layer 11, a side wall 121 of the active layer 12 and a side wall 131 of the second semiconductor layer 13.

Furthermore, the reflecting layer 22 can be served as a distributed Bragg reflector (DBR), which can increase the light reflection. The reflecting layer 22 has a multilayer structure, and therefore a total reflection can be occurred at the reflecting layer 22. Herein, each layer of the multilayer structure can be an insulating layer, such as an oxide film, a nitride film, or an oxynitride film. For example, the material for each layer of the multilayer structure can be $SiO_2$, $SiN_x$, $SiO_xN_y$, $TiO_2$, $Si_3N_4$, $Al_2O_3$, $ZrO_2$, TiN, AlN, TiAlN, TiSiN, or a combination thereof. However, the present disclosure is not limited thereto.

The light emitting units disclosed in the aforesaid Embodiments 1 to 5 can be applied to a display device. Hereinafter, several examples of the display devices of the present disclosure are illustrated.

Embodiment 6

Figure 7:
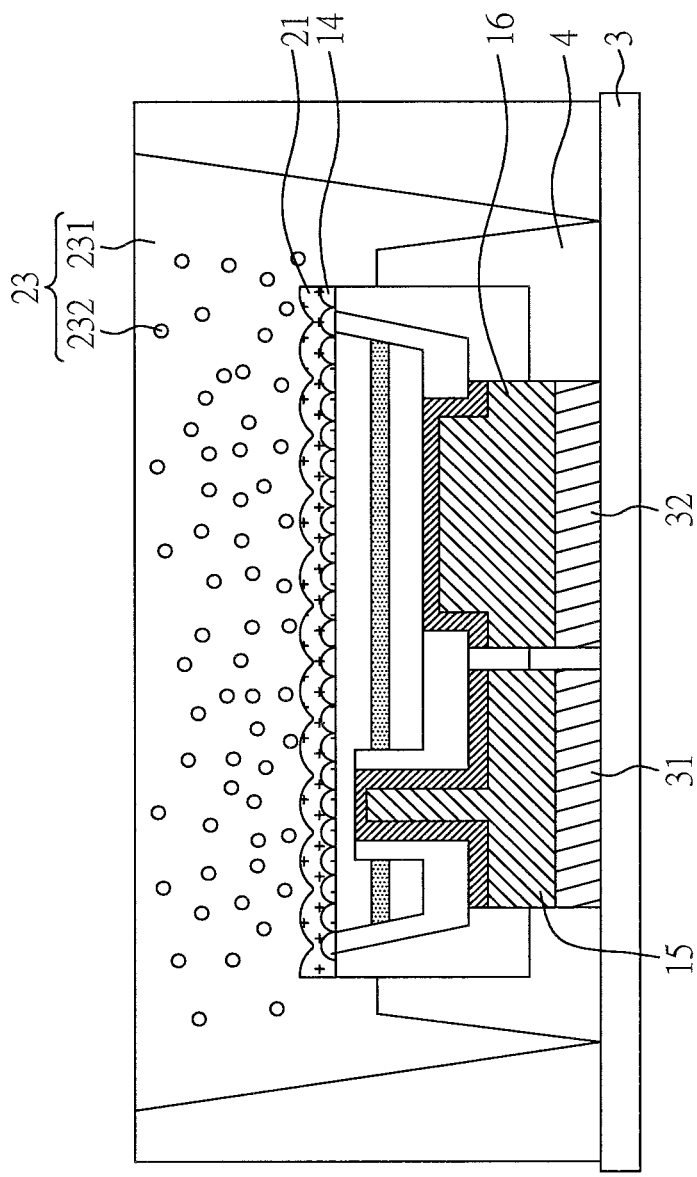
FIG. 7 is a cross-sectional view of a display device according to Embodiment 6 of the present disclosure.

FIG. 7 is a cross-sectional view of a display device of the present embodiment. In the present embodiment, the structure shown in FIG. 5 is used, so only the structure differences are illustrated below.

In the present embodiment, the light emitting unit further comprises a light converting layer 23 disposed on the first protecting layer 14. Herein, the light converting layer 23 is also disposed on the second protecting layer 21. The light converting layer 23 comprises an encapsulating layer 231 (for example, a surfer-based encapsulating layer) and quantum dots 232 dispersed in the encapsulating layer 231. The quantum dots play as light color converting elements.

In addition, in the present embodiment, the display device further comprises a base 3, wherein a first pad 31 and a second pad 32 are disposed on the base 3. Herein, the material for the first pad 31 and the second pad 32 can be, for example, Ag, Al, Ni, Cr, Cu, Au, Pd, Pt or an alloy thereof, but the present disclosure is not limited thereto.

In the present embodiment, the light emitting unit is disposed on the base 3, the first electrode 15 electrically connects to the first pad 31, the second electrode 16 electrically connects to the second pad 32, and a second encapsulating layer 4 is around a part of the first electrode 15, a part of the second electrode 16, the first pad 31 and the second pad 32. Herein, the second encapsulating layer 4 can be silicon-based encapsulating layer. The material for the silicon-based encapsulating layer can be, for example, silicon oxide, silicon nitride, silicon oxynitride or a combination thereof, but the present disclosure is not limited thereto.

The encapsulating material for encapsulating the quantum dots 232 is a surfer-based material, which may cause the sulfidation of the first electrode 15, the second electrode 16, the first pad 31 and the second pad 32. Hence, in the present embodiment, when the second encapsulating layer 4 is disposed to be around the first electrode 15, the second electrode 16, the first pad 31 and the second pad 32, the sulfidation of the first electrode 15, the second electrode 16, the first pad 31 and the second pad 32 can be prevented.

However, in other embodiment of the present disclosure, if the light converting layer 23 does not comprise quantum dots but comprises phosphors or other light color converting materials, the material for encapsulating the phosphors may be or not be the surfer-based encapsulating.

Embodiment 7

Figure 8:
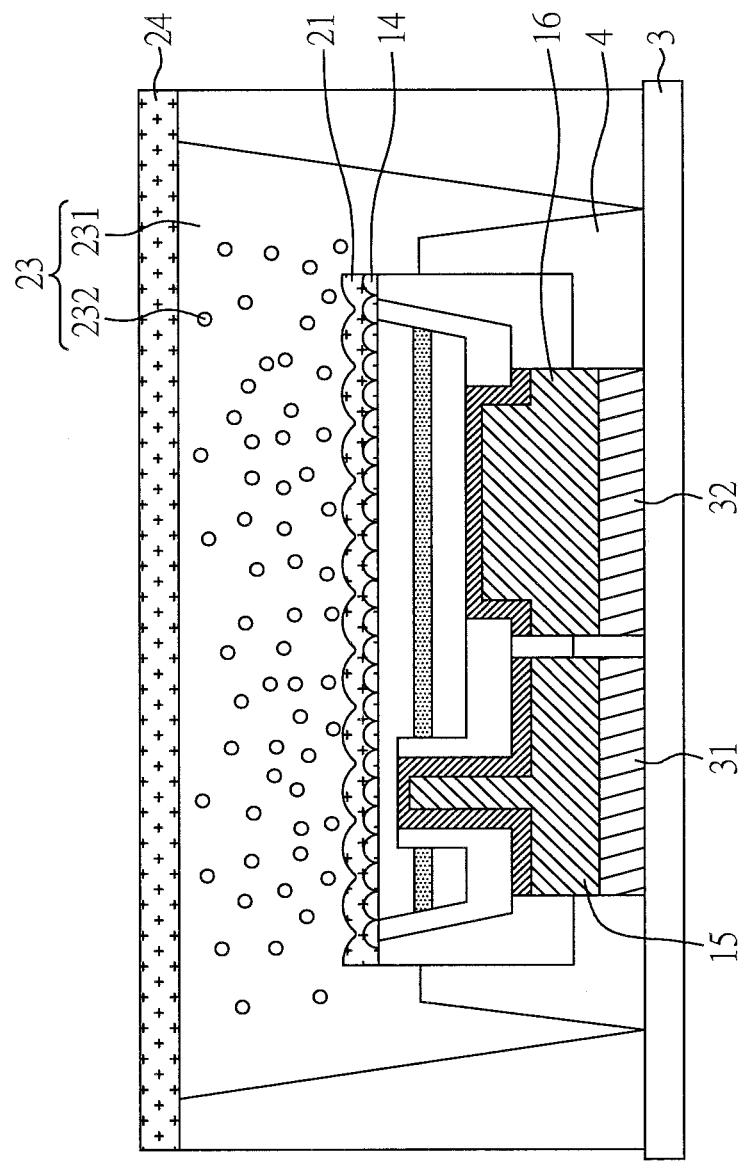
FIG. 8 is a cross-sectional view of a display device according to Embodiment 7 of the present disclosure.

FIG. 8 is a cross-sectional view of a display device of the present embodiment. The display device of the present embodiment is similar to that shown in Embodiment 6, except that the light emitting unit further comprises a third protecting layer 24 disposed on the light converting layer 23. The disposition of the third protecting layer 24 can prevent the deterioration of the quantum dots 232. The material for the third protecting layer 24 can be, for example, silicon oxide, silicon nitride, silicon oxynitride, aluminum oxide, resin, polymer, photoresist, or a combination thereof, but the present disclosure is not limited thereto.

Embodiment 8

Figure 9:
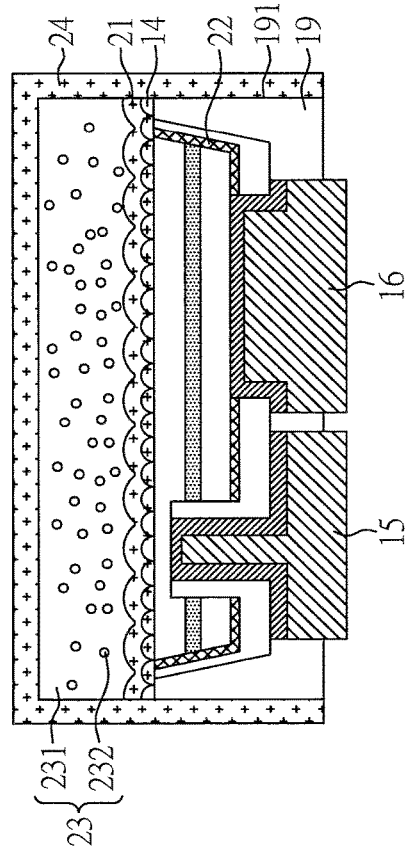
FIG. 9 is a cross-sectional view of a light emitting unit according to Embodiment 8 of the present disclosure.

FIG. 9 is a cross-sectional view of a light emitting unit of the present embodiment. In the present embodiment, the structure shown in FIG. 6 is used, so only the structure differences are illustrated below.

In the present embodiment, the light emitting unit further comprises a light converting layer 23 disposed on the first protecting layer 14. Herein, the light converting layer 23 is also disposed on the second protecting layer 21. The light converting layer 23 comprises an encapsulating layer 231 (for example, a surfer-based encapsulating layer) and quantum dots 232 dispersed in the encapsulating layer 231.

In addition, the light emitting unit further comprises a third protecting layer 24, and the third protecting layer 24 is disposed on the light converting layer 23 and a side wall 191 of the first encapsulating layer 19.

Embodiment 9

Figure 10:
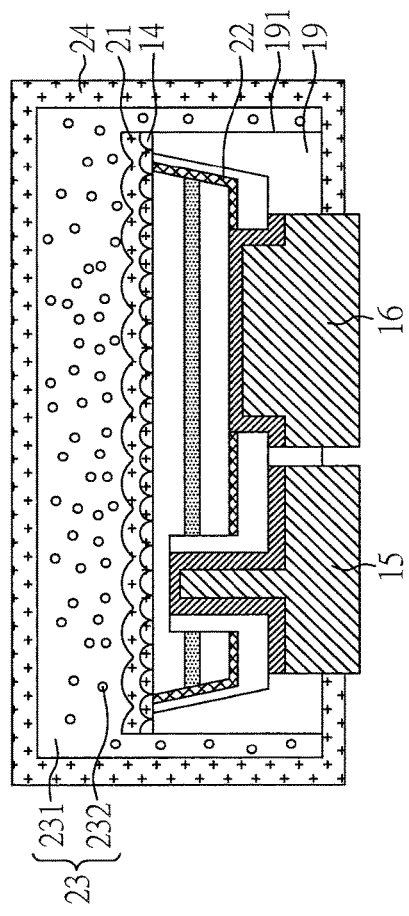
FIG. 10 is a cross-sectional view of a light emitting unit according to Embodiment 9 of the present disclosure.

FIG. 10 is a cross-sectional view of a light emitting unit of the present embodiment. The display device of the present embodiment is similar to that shown in Embodiment 8, except that the light converting layer 23 is further disposed between the third protecting layer 24 and the side wall 191 of the first encapsulating layer 19.

Embodiment 10

Figure 11:
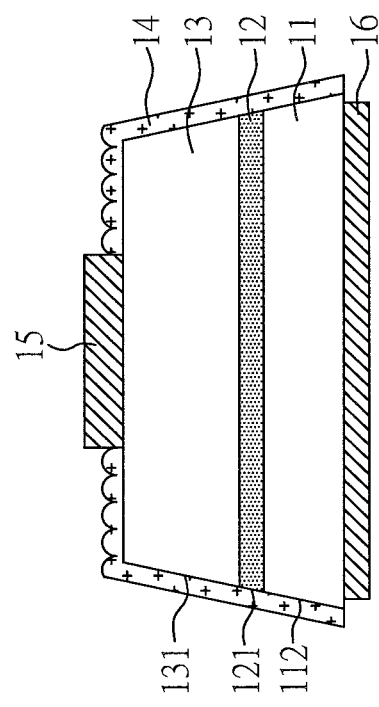
FIG. 11 is a cross-sectional view of a light emitting unit according to Embodiment 10 of the present disclosure.

FIG. 11 is a cross-sectional view of a light emitting unit of the present embodiment. The light emitting unit of the present embodiment comprises: a first semiconductor layer 11; an active layer 12 disposed on the first semiconductor layer 11; a second semiconductor layer 13 disposed on the active layer 12; and a first protecting layer 14 disposed on the second semiconductor layer 13. Herein, the first protecting layer 14 is further disposed on a side wall 131 of the second semiconductor layer 13, a side wall 121 of the active layer 12, and a side wall 112 of the first semiconductor layer 11.

In addition, the light emitting unit further comprises: a first electrode 15 and a second electrode 16, the first electrode 15 electrically connects to the second semiconductor layer 13, and the second electrode 16 electrically connects to the first semiconductor layer 11. Herein, the first electrode 15 is disposed on the second semiconductor layer 13, and the second electrode 16 is disposed under the first semiconductor layer 11. The first protecting layer 14 is disposed on a region of the second semiconductor layer 13 without the first electrode 15 formed thereon.

Other features of the light emitting unit of the present embodiment are similar to those illustrated in the aforementioned embodiments, and not repeated again.

Embodiment 11

Figure 12:
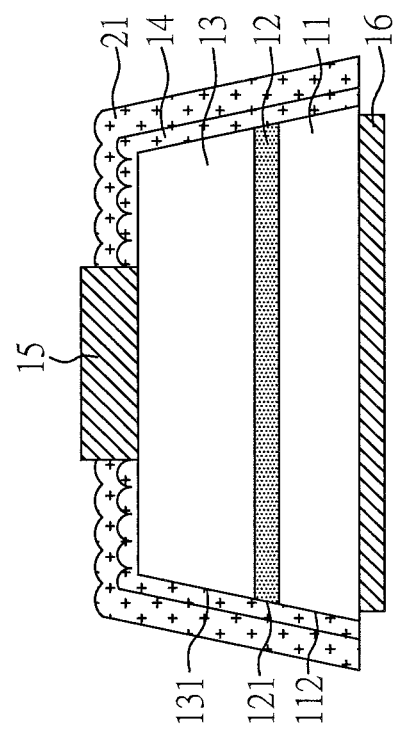
FIG. 12 is a cross-sectional view of a light emitting unit according to Embodiment 11 of the present disclosure.

FIG. 12 is a cross-sectional view of a light emitting unit of the present embodiment. The light emitting unit of the present embodiment is similar to that shown in Embodiment 10, except that the light emitting unit of the present embodiment further comprises: a second protecting layer 21 disposed on the first protecting layer 14. More specifically, all the surfaces of the first protecting layer 14 are covered by the second protecting layer 21.

Other features of the light emitting unit of the present embodiment are similar to those illustrated in the aforementioned embodiments, and not repeated again.

The light emitting unit made as described in any of the embodiments of the present disclosure as described previously can be applied to various fields, such as lamps, display devices, or other light source contained in an electronic device.

In addition, the display device made as described in any of the embodiments of the present disclosure as described previously can be co-used with a touch panel to form a touch display device. Meanwhile, a display device or touch display device may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device, comprising:
a light emitting unit, comprising:
a first semiconductor layer;
an active layer disposed on the first semiconductor layer;
a second semiconductor layer disposed on the active layer; and
a first protecting layer disposed on the second semiconductor layer,
wherein the first protecting layer comprises oxygen, nitrogen, and at least one element selected from the group consisting of Al, Ga, In, and Si;
wherein, close to the second semiconductor layer, the first protecting layer has a first oxygen atomic percentage and a first nitrogen atomic percentage, and the first oxygen atomic percentage is less than the first nitrogen atomic percentage.

2. The display device of claim 1, wherein the first protecting layer has a first top surface, the first semiconductor layer has a second top surface, the first top surface has a first roughness, the second top surface has a second roughness, and the first roughness is greater than the second roughness.

3. The display device of claim 1, wherein the light emitting unit further comprises a second protecting layer disposed on the first protecting layer, the first protecting layer has a first top surface, the second protecting layer has a third top surface, the first top surface has a first roughness, the third top surface has a third roughness, and the first roughness is greater than the third roughness.

4. The display device of claim 1, wherein the light emitting unit further comprises a second protecting layer disposed on the first protecting layer, the second protecting layer has a second oxygen atomic percentage, and the first oxygen atomic percentage is less than the second oxygen atomic percentage.

5. The display device of claim 1, wherein the light emitting unit further comprises a second protecting layer disposed on the first protecting layer, the second protecting layer has a second nitrogen atomic percentage, and the first nitrogen atomic percentage is less than the second nitrogen atomic percentage.

6. The display device of claim 1, wherein the light emitting unit further comprises a first electrode and a second electrode, the first electrode electrically connects to the second semiconductor layer, and the second electrode electrically connects to the first semiconductor layer.

7. The display device of claim 6, wherein the first electrode and the second electrode are disposed below the first semiconductor layer, a via hole penetrates through the first semiconductor layer and the active layer, and at least a part of the first electrode is disposed in the via hole.

8. The display device of claim 7, wherein a part of the via hole is further extended into the second semiconductor layer.

9. The display device of claim 7, wherein the light emitting unit further comprises a passivation layer, the passivation layer is disposed between the first electrode in the via hole and the first semiconductor layer, and the passivation layer is also disposed on a side wall of the via hole.

10. The display device of claim 6, wherein the light emitting unit further comprises a reflecting layer, the first semiconductor layer has a bottom surface, the second electrode is disposed on the bottom surface, and the reflecting layer is disposed on the bottom surface without the second electrode formed thereon.

11. The display device of claim 10, wherein the reflecting layer is further disposed on side walls of the first semiconductor layer, the active layer and the second semiconductor layer.

12. The display device of claim 10, wherein the reflecting layer has a multilayer structure, and each layer of the multilayer structure is an oxide film, a nitride film, an oxynitride film, or a combination thereof.

13. The display device of claim 6, wherein the light emitting unit further comprises a light converting layer disposed on the first protecting layer, and the light converting layer comprises an encapsulating layer and quantum dots dispersed in the encapsulating layer.

14. The display device of claim 13, wherein the light emitting unit further comprises a third protecting layer disposed on the light converting layer.

15. The display device of claim 13, wherein the light emitting unit further comprises a first encapsulating layer, the first encapsulating layer is around a part of the first electrode and a part of the second electrode, and the first encapsulating layer is disposed on side walls of the first semiconductor layer, the active layer and the second semiconductor layer.

16. The display device of claim 15, wherein the light emitting unit further comprises a third protecting layer, and the third protecting layer is disposed on the light converting layer and a side wall of the first encapsulating layer.

17. The display device of claim 16, wherein the light converting layer is disposed between the third protecting layer and the side wall of the first encapsulating layer.

18. The display device of claim 13, further comprises a base, wherein a first pad and a second pad are disposed on the base, the light emitting unit is disposed on the base, the first electrode electrically connects to the first pad, the second electrode electrically connects to the second pad, and a second encapsulating layer is around a part of the first electrode, a part of the second electrode, the first pad and the second pad.

19. A light emitting unit, comprising:
a first semiconductor layer;
an active layer disposed on the first semiconductor layer;
a second semiconductor layer disposed on the active layer; and
a first protecting layer disposed on the second semiconductor layer,
wherein the first protecting layer comprises oxygen, nitrogen, and at least one element selected from the group consisting of Al, Ga, In, and Si;
wherein, close to the second semiconductor layer, the first protecting layer has a first oxygen atomic percentage and a first nitrogen atomic percentage, and the first oxygen atomic percentage is less than the first nitrogen atomic percentage.

\* \* \* \* \*